United States Patent
Kobayashi

(10) Patent No.: US 10,038,325 B2
(45) Date of Patent: Jul. 31, 2018

(54) ELECTRIC STORAGE DEVICE AND DETERIORATION DETERMINATION METHOD

(71) Applicant: NEC Corporation, Tokyo (JP)

(72) Inventor: Kenji Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 410 days.

(21) Appl. No.: 14/766,031

(22) PCT Filed: Nov. 1, 2013

(86) PCT No.: PCT/JP2013/079731
§ 371 (c)(1),
(2) Date: Aug. 5, 2015

(87) PCT Pub. No.: WO2014/122832
PCT Pub. Date: Aug. 14, 2014

(65) Prior Publication Data
US 2015/0372514 A1    Dec. 24, 2015

(30) Foreign Application Priority Data
Feb. 6, 2013   (JP) ................. 2013-021561

(51) Int. Cl.
*G01N 27/416*   (2006.01)
*H02J 7/00*     (2006.01)
(Continued)

(52) U.S. Cl.
CPC ........ *H02J 7/0014* (2013.01); *G01R 31/3679* (2013.01); *H01M 10/482* (2013.01);
(Continued)

(58) Field of Classification Search
CPC .................................................. G01R 31/3679
(Continued)

(56) References Cited

U.S. PATENT DOCUMENTS

2007/0257642 A1*  11/2007  Xiao ............... H02J 7/0026
                                                    320/134
2011/0140665 A1*   6/2011  Tamezane ........ H02J 7/0016
                                                    320/118
(Continued)

FOREIGN PATENT DOCUMENTS

JP    3370047        1/2003
JP    2003-282156   10/2003
(Continued)

OTHER PUBLICATIONS

International Search Report dated Nov. 26, 2013 in corresponding PCT International Application.

*Primary Examiner* — David V Henze-Gongola
(74) *Attorney, Agent, or Firm* — Finnegan, Henderson, Farabow, Garrett & Dunner, L.L.P.

(57) ABSTRACT

An object of the present invention is to provide a new method for performing deterioration determination of a lithium ion secondary battery. In order to attain the object, in the present invention, there is provided a electric storage device (10) including a battery unit (11) including a plurality of battery cells which are connected to each other, a charge and discharge control unit (12) controlling charge and discharge of the plurality of battery cells, a cell balance unit (13) performing balance processing which corrects a difference in a cell voltage between the plurality of battery cells, and a determination unit (14) performing deterioration determination of each of the plurality of battery cells in a state in which the balance processing is disabled when the charge and discharge based on the control of the charge and discharge control unit (12) is not performed for greater than or equal to a predetermined period of time.

8 Claims, 6 Drawing Sheets

(51) Int. Cl.
  *H01M 10/48* (2006.01)
  *G01R 31/36* (2006.01)
  *H01M 10/44* (2006.01)
  *H01M 10/42* (2006.01)
(52) U.S. Cl.
  CPC .......... *H02J 7/007* (2013.01); *H01M 10/441* (2013.01); *H01M 2010/4271* (2013.01); *H02J 7/0021* (2013.01)
(58) Field of Classification Search
  USPC .................. 324/427, 429–430, 432; 320/118
  See application file for complete search history.

(56) References Cited

U.S. PATENT DOCUMENTS

| | | | | |
|---|---|---|---|---|
| 2011/0285356 A1* | 11/2011 | Maluf | .................. | H02J 7/0052 320/139 |
| 2011/0288691 A1* | 11/2011 | Abe | ......................... | F03D 7/00 700/292 |

FOREIGN PATENT DOCUMENTS

| | | |
|---|---|---|
| JP | 2008-80963 | 4/2008 |
| JP | 2009-95211 | 4/2009 |
| JP | 2010-249793 | 11/2010 |
| WO | WO 2012/105448 A1 | 8/2012 |

\* cited by examiner

ELECTRIC STORAGE DEVICE AND DETERIORATION DETERMINATION METHOD

CROSS-REFERENCE TO RELATED PATENT APPLICATIONS

This application is a National Stage Entry of International Application No. PCT/JP2013/079731, filed Nov. 1, 2013, which claims priority from Japanese Patent Application No. 2013-021561, filed Feb. 6, 2013. The entire contents of the above-referenced applications are expressly incorporated herein by reference.

TECHNICAL FIELD

The present invention relates to an electric storage device and a deterioration determination method.

BACKGROUND ART

A deterioration determination method of a lithium secondary battery is disclosed in Patent Document 1. In the deterioration determination method, an estimated capacity of the lithium ion battery is calculated from a voltage change during charge, and when the estimated capacity is smaller than a limit capacity which is set in advance, the lithium secondary battery is determined as being deteriorated.

In addition, a battery monitor device for detecting a battery state is disclosed in Patent Document 2. The battery monitor device has a function of setting a balancing switch to be in an off state during a measurement period of a cell voltage.

RELATED DOCUMENTS

Patent Documents

[Patent Document 1] Japanese Patent No. 3370047
[Patent Document 2] Japanese Unexamined Patent Application Publication No. 2010-249793

DISCLOSURE OF THE INVENTION

The present inventor has newly found the following problems. When the lithium ion secondary battery stands in a state of not being used for a long period of time (in a state where charge and discharge excluding self-discharge are not performed), property deterioration may progress (a decrease in a battery capacity) compared to a state before standing. There was no deterioration determination method considering such conditions.

An object of the present invention is to provide a new method for performing deterioration determination of a lithium ion secondary battery.

According to the present invention, there is provided a electric storage device including a battery unit including a plurality of battery cells which are connected to each other; a charge and discharge control unit controlling charge and discharge of the plurality of battery cells; a cell balance unit performing balance processing which corrects a difference in a cell voltage between the plurality of battery cells; and a determination unit performing deterioration determination of each of the plurality of battery cells in a state in which the balance processing is disabled when the charge and discharge based on the control of the charge and discharge control unit is not performed for greater than or equal to a predetermined period of time.

In addition, according to the present invention, there is provided a deterioration determination method, in which an electric storage device including a battery unit including a plurality of battery cells which are connected to each other, a charge and discharge control unit controlling charge and discharge of the plurality of battery cells, and a cell balance unit performing balance processing which corrects a difference in a cell voltage between the plurality of battery cells performs deterioration determination of each of the plurality of battery cells in a state in which the balance processing is disabled when the charge and discharge based on the control of the charge and discharge control unit is not performed for greater than or equal to a predetermined period of time.

According to the present invention, a new method for performing deterioration determination of a lithium ion secondary battery is realized.

BRIEF DESCRIPTION OF THE DRAWINGS

The object described above, and other objects, characteristics, and advantages will become more obvious with reference to the following preferred exemplary embodiments and the following drawings attached thereto.

DESCRIPTION OF EXEMPLARY EMBODIMENTS

Figure 1:
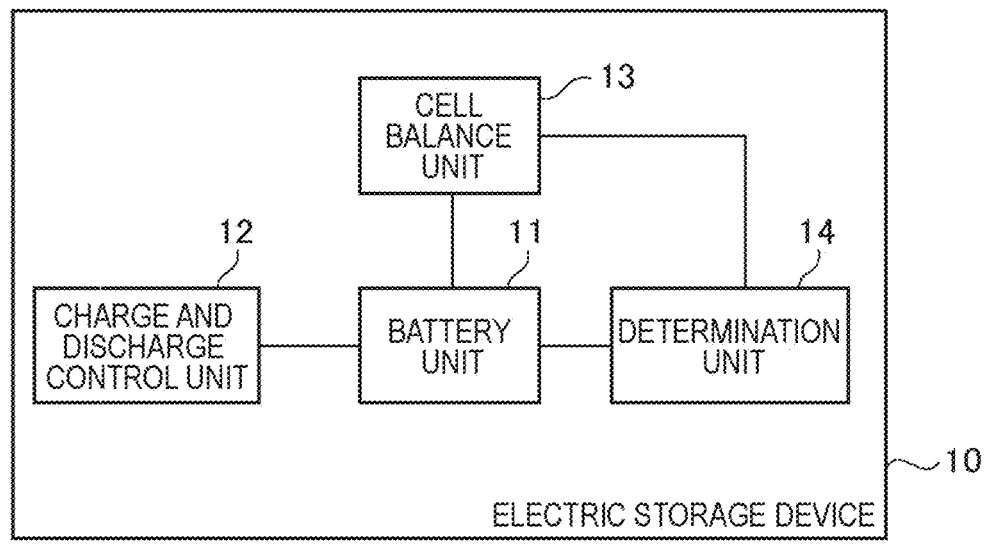
FIG. 1 is an example of a functional block diagram of an electric storage device of an exemplary embodiment.

Hereinafter, exemplary embodiments of the present invention will be described with reference to the drawings. Furthermore, in a plurality of drawings, the same reference numerals are applied to the same constituent parts, and the description thereof will not be repeated.

Furthermore, a system and a device of the exemplary embodiments are realized by an arbitrary combination of hardware and software with a focus on a CPU, a memory, a program loaded on a memory (including a program downloaded from a memory medium such as a CD or a server or the like on the Internet in addition to a program which is stored in a memory in advance from a shipping stage of the device), a memory unit such as hard disk which stores the program, and an interface for network connection of an arbitrary computer. Then, a person skilled in the art will understand that a realization method and a device thereof include various modification examples.

In addition, a functional block diagram used for describing the exemplary embodiments does not illustrate a configuration of a hardware unit, but a block of a functional unit. In these drawings, it is described that each system and each device are realized by one instrument, but a realization unit thereof is not limited thereto. That is, each system and each device may be configured to be physically divided, or may be configured to be logically divided.

First Exemplary Embodiment

In FIG. 1, an example of a functional block diagram of an electric storage device of this exemplary embodiment is illustrated. As illustrated, an electric storage device 10 of this exemplary embodiment includes a battery unit 11, a charge and discharge control unit 12, a cell balance unit 13, and a determination unit 14.

The battery unit 11 includes a plurality of battery cells (lithium ion secondary battery cell) which are connected to each other in series and/or in parallel. The charge and discharge control unit 12 controls charge with respect to each of the plurality of battery cells and discharge from each of the plurality of battery cells. The cell balance unit 13 performs balance processing which corrects a difference in a cell voltage between the plurality of battery cells. Furthermore, the balance processing herein is not particularly limited, and the balance processing may be processing which decreases a voltage value of the other battery cell to a voltage value of a battery cell having the smallest voltage value by using resistance, or may be processing which performs replenishment between the plurality of battery cells by using a capacitor.

The battery unit 11, the charge and discharge control unit 12, and the cell balance unit 13 are able to adopt a configuration based on the related art.

When the charge and discharge based on the control of the charge and discharge control unit 12 is not performed for greater than or equal to a predetermined period of time, the determination unit 14 performs deterioration determination of each of the plurality of battery cells in a state where balance processing of the cell balance unit 13 is disabled. Furthermore, the self-discharge is not included in the discharge based on the control of the charge and discharge control unit 12.

When the lithium ion secondary battery stands in a state of not being used for along period of time (in a state where the charge and the discharge excluding self-discharge are not performed), property deterioration (a decrease in a battery capacity) may progress, compared to a state before standing. For this reason, when such a state is continued for greater than or equal to a predetermined period of time, it is preferable to perform the deterioration determination of each of the plurality of battery cells. Accordingly, it is possible to detect the deterioration state early.

Therefore, the determination unit 14 determines whether or not to perform the deterioration determination on the basis of the continuance of a state of not using the lithium ion secondary battery for a long period of time, that is, a period of time during which a state where the charge and discharge based on the control of the charge and discharge control unit 12 is not performed is continued. Specifically, when the charge and discharge based on the control of the charge and discharge control unit 12 is not performed for greater than or equal to a predetermined period of time, the deterioration determination is performed. The predetermined period of time is an engineering expedient which is able to be determined on the basis of a design of the battery cell, or the like, and for example, is greater than or equal to 72 hours. In this exemplary embodiment, the detail of the deterioration determination of the determination unit 14 is not particularly limited.

Furthermore, the determination unit 14 performs the deterioration determination in a state where the balance processing of the cell balance unit 13 is disabled. That is, the balance processing is not performed while the determination unit 14 performs the deterioration determination.

According to the electric storage device of this exemplary embodiment described above which determines whether or not to perform the deterioration determination on the basis of a period of time during which the charge and discharge based on the control of the charge and discharge control unit 12 is not performed, the deterioration determination is performed at a suitable timing, and thus it is possible to detect that property deterioration progresses early.

In addition, the electric storage device of this exemplary embodiment performs the deterioration determination in a state where the balance processing is disabled. It is able to be experimentally confirmed that, in a state where an electrode is unstable such as a state immediately after the discharge (an LI distribution state), the cell voltage increases once and then is in a steady state, but the voltage does not converge in cell balancing. An electrode state is in an unstable state even after long-term storage, and thus it is estimated that the same phenomenon as that described above occurs. According to the electric storage device of this exemplary embodiment which performs the deterioration determination in a state where the balance processing is disabled, it is possible to prevent accuracy of a determination result of each of the plurality of battery cells from being degraded by using the balance processing.

Second Exemplary Embodiment

Figure 2:
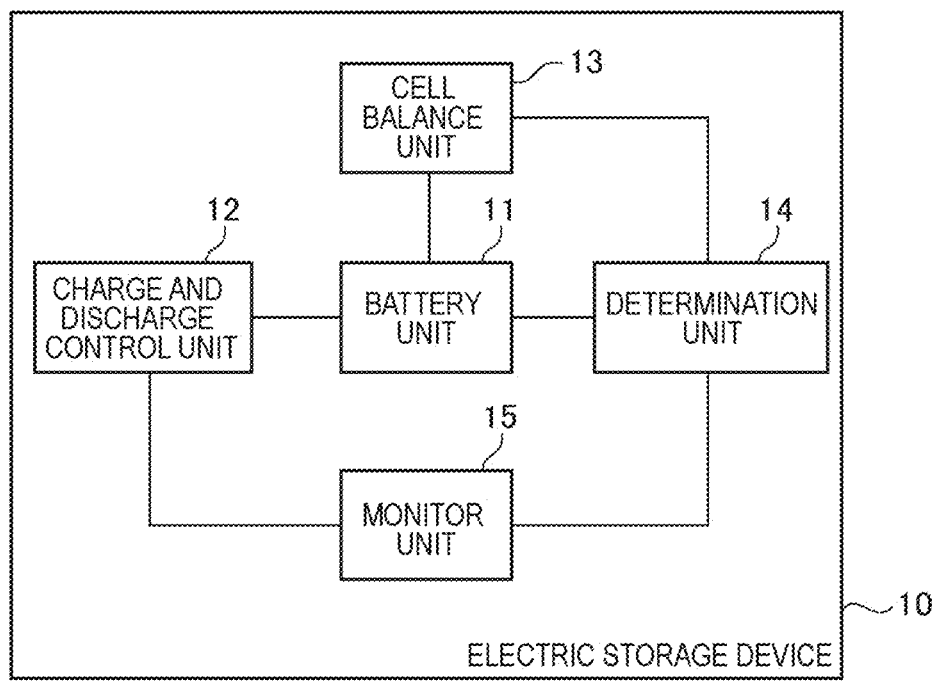
FIG. 2 is an example of a functional block diagram of the electric storage device of an exemplary embodiment.

In FIG. 2, an example of a functional block diagram of an electric storage device of this exemplary embodiment is illustrated. As illustrated, the electric storage device 10 of this exemplary embodiment includes the battery unit 11, the charge and discharge control unit 12, the cell balance unit 13, the determination unit 14, and a monitor unit 15.

The monitor unit 15 monitors a period of time during which a state where the charge and discharge based on the control of the charge and discharge control unit 12 is not performed is continued, and when the state is continued for greater than or equal to a predetermined period of time (engineering expedient), inputs determination start information indicating the continued state into the determination unit 14.

When the input of the determination start information is received from the monitor unit 15, afterward the determination unit 14 of this exemplary embodiment disables the balance processing, and starts the deterioration determination. For example, when the input of the determination start information is received, the determination unit 14 may disables the balance processing by using the reception as a trigger, and may start the deterioration determination. In addition, when the input of the determination start information is received, the determination unit 14 may disables the balance processing by using a predetermined timing after that as a trigger, and may start the deterioration determination. It is considered that the predetermined timing after that, for example, is a timing at which a predetermined operation of the electric storage device 10 is started, a timing at which the predetermined operation is performed by a user, a timing of reaching a predetermined time (for example: at 0 o'clock), or the like, but the predetermined timing after that is not limited thereto. The other configuration of the determination unit 14 is identical to that described in the first exemplary embodiment.

In addition, the configuration of the battery unit 11, the charge and discharge control unit 12, and the cell balance unit 13 are identical to those described in the first exemplary embodiment.

According to the electric storage device of this exemplary embodiment described above, the same functional effect as that of the first exemplary embodiment is able to be realized.

In addition, according to the electric storage device of this exemplary embodiment, it is possible to automatically start the deterioration determination on the basis of a period of time during which the charge and discharge based on the control of the charge and discharge control unit 12 is not performed, and thus it is possible to reduce a burden on the user.

Third Exemplary Embodiment

Figure 3:
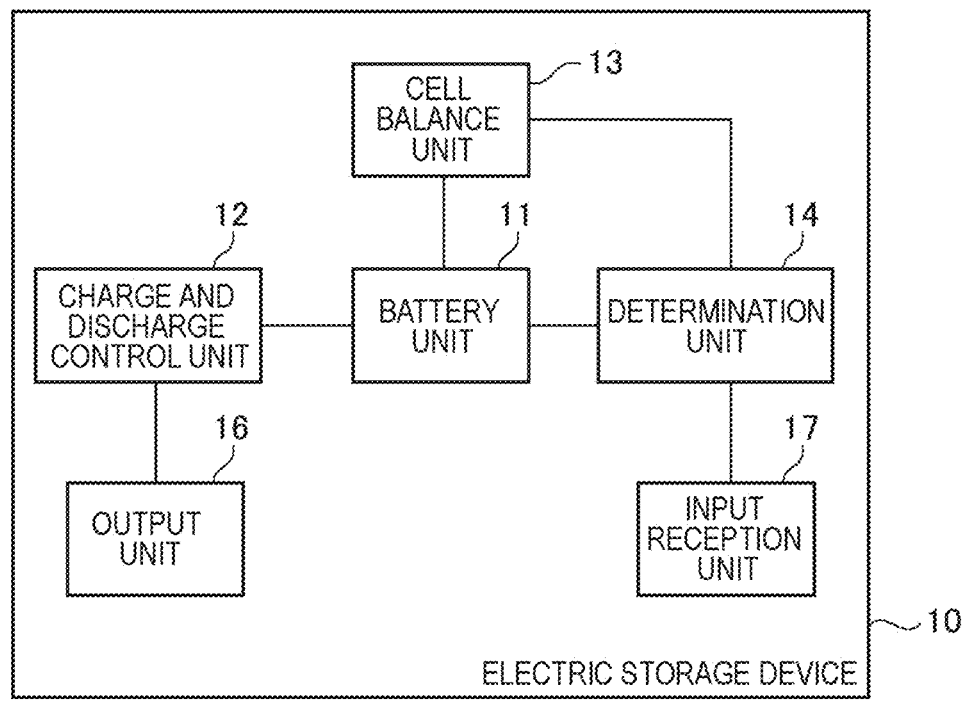
FIG. 3 is an example of a functional block diagram of the electric storage device of an exemplary embodiment.

In FIG. 3, an example of a functional block diagram of an electric storage device of this exemplary embodiment is illustrated. As illustrated, the electric storage device 10 of this exemplary embodiment includes the battery unit 11, the charge and discharge control unit 12, the cell balance unit 13, the determination unit 14, an output unit 16, and an input reception unit 17.

The output unit 16 monitors a period of time during which a state where the charge and discharge based on the control of the charge and discharge control unit 12 is not performed is continued, and outputs determination start information which indicates when the state is continued for greater than or equal to a predetermined period of time (engineering expedient) toward the user. The output unit is not particularly limited, and is able to be realized through any output device such as a display, a speaker, and warning light.

The input reception unit 17 receives an instruction input which starts the deterioration determination from the user. That is, the user who confirms the determination start information output by the output unit 16 is able to perform the instruction input which starts the deterioration determination through the input reception unit 17. Furthermore, the unit receiving the input is not particularly limited, and is able to be realized through any input device such as an operation button, a touch panel display, a keyboard, a mouse, and a microphone.

When the input reception unit 17 receives the instruction input, afterward the determination unit 14 of this exemplary embodiment disables the balance processing, and starts the deterioration determination. The other configurations of the determination unit 14 are identical to those described in the first exemplary embodiment.

In addition, the configuration of the battery unit 11, the charge and discharge control unit 12, and the cell balance unit 13 is identical to that described in the first exemplary embodiment.

According to the electric storage device of this exemplary embodiment described above, the same functional effect as that of the first exemplary embodiment and the second exemplary embodiment is able to be realized.

In addition, it is possible to perform the deterioration determination according to the instruction input of the user, and thus it is possible to prevent undesirable deterioration determination from being performed at a timing unintended by the user. Furthermore, it is possible to output the information which indicates when the state where the charge and discharge based on the control of the charge and discharge control unit 12 is not performed is continued for greater than or equal to a predetermined period of time, that is, when the deterioration determination is required toward the user, and thus it is possible to prevent necessary deterioration determination from not being performed.

Fourth Exemplary Embodiment

An example of a functional block diagram of the electric storage device 10 of this exemplary embodiment is able to be any one of FIG. 1 to FIG. 3. Hereinafter, the configuration of the determination unit 14 of this exemplary embodiment will be described. Furthermore, the configurations of the other units are identical to those described in the first exemplary embodiment to the third exemplary embodiment, and thus the description thereof will not be repeated herein.

The determination unit 14 of this exemplary embodiment includes a first determination unit which repeats a plurality of times measurement processing of charging each of the plurality of battery cells up to a predetermined voltage value (Engineering expedient. Example: SOC is 100%), then discharging each of the plurality of battery cells (Engineering expedient. Example: the discharge is performed until SOC is less than or equal to 50%), and measuring a charge voltage value (hereinafter, referred to as a "charge voltage value after the start of the discharge") within a predetermined period of time (Engineering expedient. Example: approximately 1 minute to 2 minutes) from the start of the discharge, and after that, determines a deterioration state of each of the plurality of battery cells in consideration of a change mode of the charge voltage value after the start of the discharge due to the repetition of the charge and discharge. The discharge is able to be performed by being connected to a predetermined load. A measurement unit for measuring the charge voltage value after the start of the discharge is not particularly limited.

Furthermore, it is not necessary that the charge and discharge for determining the deterioration state by using the first determination unit is specialized for determining the deterioration state, and the charge and the discharge in practical use of an electric storage device by the user are able to be used. That is, in the background of practical use of the electric storage device by the user, it is possible to perform determination processing of the deterioration state.

Here, the present inventor has ensured that when the lithium ion secondary battery stands in a state of not being used for a long period of time (in a state where the charge and the discharge excluding self-discharge are not performed), property deterioration (a decrease in a battery capacity) may temporarily progress compared to a state before standing, and a state where the temporary property deterioration progress is gradually recovered by the repetition of the charge and discharge (the degree of the property deterioration is recovered). It is considered that the temporary property deterioration is due to a fact that a lithium distribution in the battery is considerably different before and after standing. In a case of a large-sized battery having a large battery area, in order to make the distribution in a steady state, a great deal of time is required compared to a case of a small-sized battery.

Furthermore, the property deterioration of the lithium ion secondary battery may actually progress due to some factors caused by the standing for a long period of time. That is, instead of the temporary property deterioration, property deterioration which is rarely recovered may progress. For this reason, in the deterioration determination, it is necessary to distinguish these lithium ion secondary batteries from each other, and to detect the lithium ion secondary battery in which property deterioration actually progresses.

In this exemplary embodiment, the measurement processing in which each of the plurality of battery cells is charged up to a predetermined voltage value, and then is discharged, and the charge voltage value after the start of the discharge within a predetermined period of time from the start of the discharge is measured is repeated a plurality of times. Then, a deterioration state of a deterioration determination target is determined in consideration of the change mode of the charge voltage value after the start of the discharge due to the repetition of the charge and discharge.

As described in the following examples, the present inventor has confirmed that a battery cell which stands in a state of not being used for a long period of time (in a state where the charge and the discharge excluding self-discharge are not performed) and in which property deterioration (a decrease in a battery capacity) temporarily progresses compared to a state before standing has a charge voltage value after the start of the discharge which decreases compared to a value before standing, similar to a case where the property deterioration actually progresses. In addition, the present inventor has confirmed that the battery cell in which the property deterioration (a decrease in the battery capacity) temporarily progresses has a charge voltage value after the start of the discharge which is gradually recovered toward a value before standing by the repetition of the charge and discharge. Further, the present inventor has confirmed that the battery cell in which the property deterioration actually progresses does not have a charge voltage value after the start of the discharge which is recovered toward a value before standing by the repetition of the charge and discharge, or the degree of the recovery is not sufficient.

When the deterioration state of the battery cell is determined by using only a measurement result of one charge voltage value after the start of the discharge after standing, the battery cell in which the property deterioration actually progresses is not able to be clearly distinguished from the battery cell in which the property deterioration temporarily progresses, but both of the battery cells may be determined as being in a rejected state in which the property deterioration progresses up to a predetermined level. That is, the battery cell in which the property deterioration just temporarily progresses and which is originally in an acceptable state may be erroneously determined as being in a rejected state.

In this exemplary embodiment, the deterioration state of the battery cell is determined in consideration of the change mode of the charge voltage value after the start of the discharge due to the repetition of the charge and discharge, that is, the degree of the recovery. For this reason, it is possible to clearly distinguish the battery cell in which the property deterioration actually progresses from the battery cell in which the property deterioration temporarily progresses. As a result thereof, it is possible to prevent the battery cell in which the property deterioration just temporarily progresses and which is originally in an acceptable state from being erroneously determined as being in a rejected state.

Figure 8:
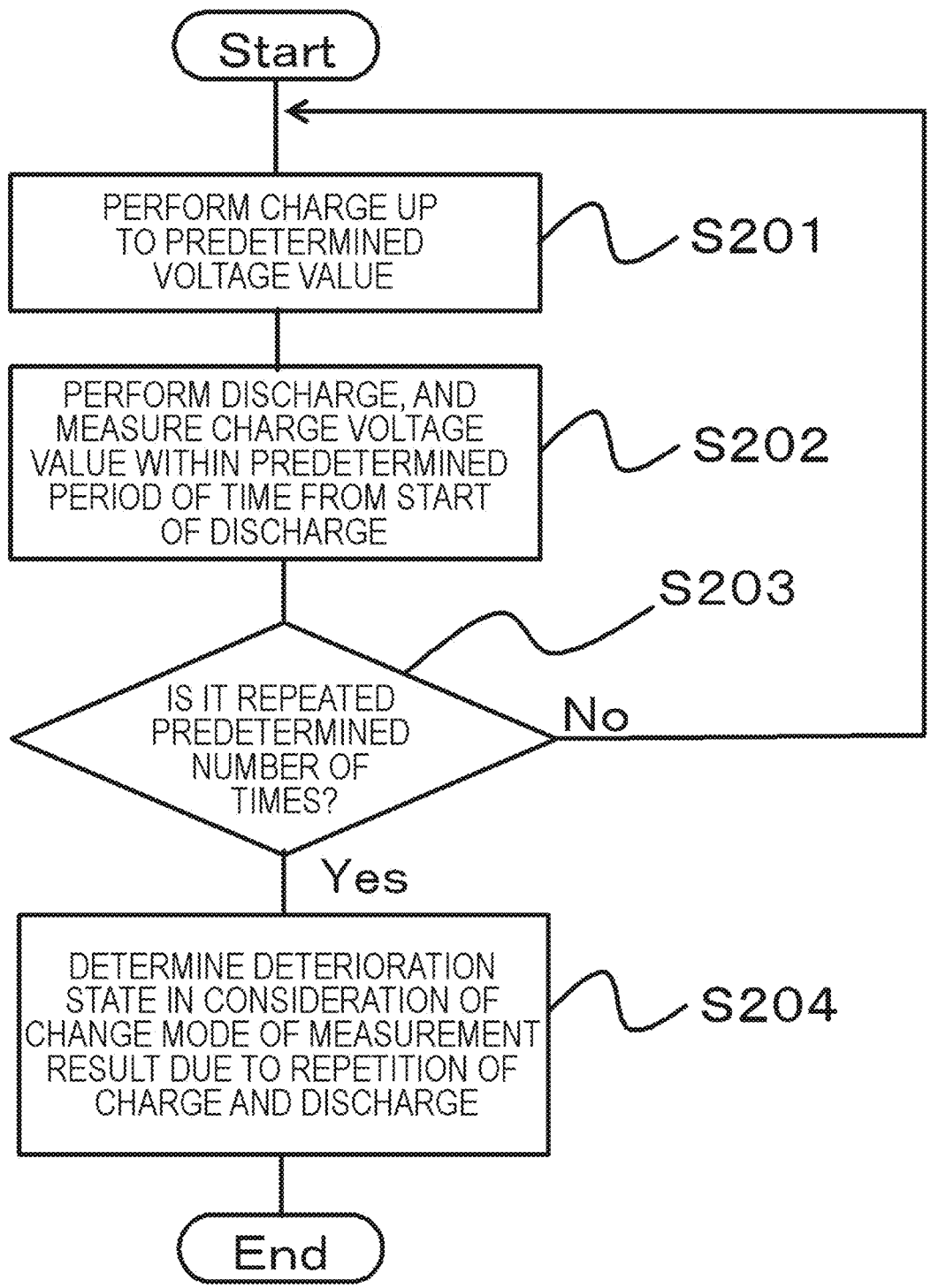
FIG. 8 is a flowchart illustrating an example of a processing flow of the electric storage device of an exemplary embodiment.

Here, a deterioration determination method of this exemplary embodiment will be described. The deterioration determination method of this exemplary embodiment includes a deterioration determination step. FIG. 8 is a flowchart illustrating an example of a processing flow of the deterioration determination step. As illustrated, in the deterioration determination step, with respect to a deterioration determination target which is a battery cell or a battery module connecting a plurality of battery cells with each other, measurement processing of charging up to a predetermined voltage value (Engineering expedient. Example: SOC is 100%) (S201), then discharging (Engineering expedient. Example: the discharge is performed until SOC is less than or equal to 50%), and measuring a charge voltage value (hereinafter, referred to as a "charge voltage value after the start of the discharge") within a predetermined period of time (Engineering expedient. Example: approximately 1 minute to 2 minutes) from the start of the discharge (S202) is repeated a plurality of times (S203), and after that, a deterioration state of the deterioration determination target is determined in consideration of a change mode of the charge voltage value after the start of the discharge due to the repetition of the charge and discharge (S204). The discharge is able to be performed by being connected to a predetermined load. A measurement unit for measuring the charge voltage value after the start of the discharge is not particularly limited.

According to the electric storage device of this exemplary embodiment described above, the same functional effect as that of the first exemplary embodiment to the third exemplary embodiment is able to be realized. In addition, it is possible to accurately perform the deterioration determination of the lithium ion secondary battery. In addition, the determination unit 14 measures the charge voltage value after the start of the discharge of each of the plurality of battery cells in a state where the balance processing is disabled, and thus is able to exclude the influence of the balance processing from a measurement value. For this reason, it is possible to accurately and briefly specify the change mode of the charge voltage value after the start of the discharge due to the repetition of the charge and discharge.

Fifth Exemplary Embodiment

An example of a functional block diagram of the electric storage device 10 of this exemplary embodiment is able to be any one of FIG. 1 to FIG. 3. Hereinafter, the configuration of the determination unit 14 of this exemplary embodiment will be described. Furthermore, the configurations of the other units are identical to those described in the first exemplary embodiment to the third exemplary embodiment, and thus the description thereof will not be repeated herein.

The first determination unit of the determination unit 14 of this exemplary embodiment is different from the determination unit 14 described in the fourth exemplary embodiment in that the first determination unit predicts the charge voltage value after the start of the discharge after repeating the charge and discharge a predetermined number of times on the basis of the change mode of the charge voltage value after the start of the discharge due to the repetition of the charge and discharge, and determines the deterioration state of each of the plurality of battery cells on the basis of a comparison result between a prediction value and a first reference value which is maintained in advance. The other configuration of the determination unit 14 of this exemplary embodiment is identical to that of the determination unit 14 of the fourth exemplary embodiment.

As described in the fourth exemplary embodiment, the temporary property deterioration appearing in the battery cell after standing for a long period of time by the repetition of the charge and discharge is gradually recovered. In this exemplary embodiment, the change mode of the charge voltage value after the start of the discharge due to the repetition of the charge and discharge is estimated by using a plurality of charge voltage values after the start of the discharge which is obtained by performing the charge and discharge and measuring the charge voltage value after the start of the discharge a plurality of times (Engineering expedient. Example: 3 times to 5 times). Then, the charge voltage value after the start of the discharge (a predicted recovery value) after repeating the charge and discharge a predetermined number of times (Engineering expedient. Example: 10 times) is estimated by using an estimation result thereof, and the deterioration state is determined on the basis of a comparison result between the estimation result (the predicted recovery value) and the first reference value set in advance.

The estimation, for example, may be realized by applying least squares fitting to data of the charge voltage value after the start of the discharge by an exponential function having a linear monotonic decrease. Specifically, $V_0$ in $V(N)=V_0$ (a convergence value)$+A(-N/B)$ (N: the number of times (hours), A: a constant, and B: a parameter depending on the state of the battery) is estimated, and the degree of the deterioration may be determined from a difference between the estimated $V_0$ and the first reference value. Furthermore, the determination unit 14 measures the charge voltage value after the start of the discharge of each of the plurality of battery cells in a state where the balance processing is disabled, and thus it is possible to exclude the influence of the balance processing from the measurement value. For this reason, it is possible to briefly perform the estimation processing, and it is possible to accurately estimate a result.

The first reference value is able to be a value which is obtained by simulating the charge voltage value after the start of the discharge in the battery cell before standing, and may be an actual measured value, or may be a value determined by a simulation. A designer may determine the first reference value in advance on the basis of the design of the battery cell and store the first reference value in the electric storage device 10. For example, the battery cell of which the predicted recovery value (a representative value among the predicted recovery values within a predetermined period of time from the start of the discharge) is greater than or equal to a predetermined ratio of the first reference value (Engineering expedient. Example: greater than or equal to 80%) may be determined as being in an acceptable state.

Furthermore, the degree of the recovery, that is, to what extent the recovery is performed by how many the number of times charge and discharge is repeated is a value which is changed according to the design (the size or the like) of the battery cell. For this reason, the number of times of the repetition of the charge and discharge, the number of times which is reference for calculating the predicted recovery value, reference for determining whether or not the battery cell is acceptable (the ratio described above or the like), and the like are engineering expedients which are determined on the basis of the design of the battery cell included in each of the electric storage device 10.

Figure 9:
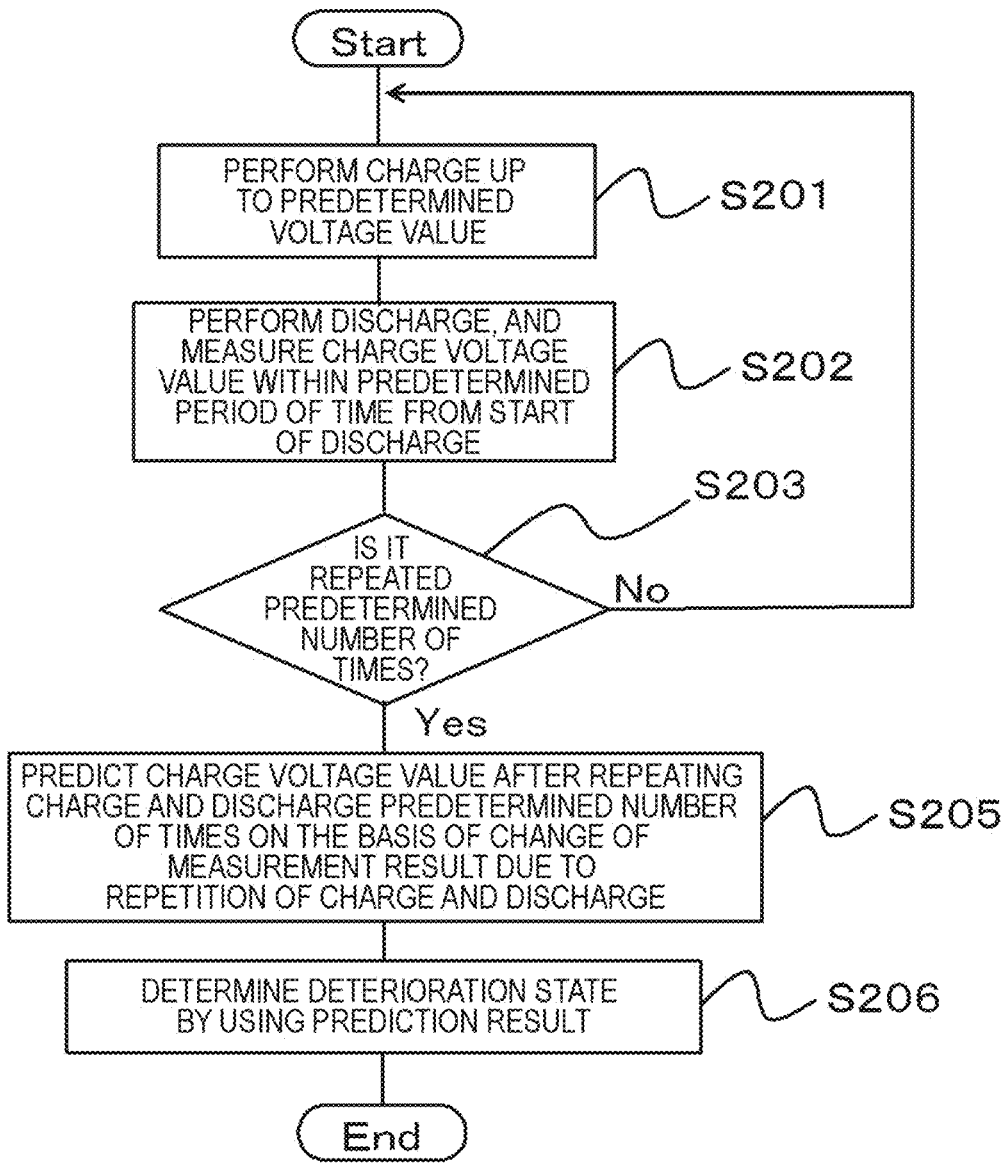
FIG. 9 is a flowchart illustrating an example of a processing flow of the electric storage device of an exemplary embodiment.

Here, a deterioration determination method of this exemplary embodiment will be described. FIG. 9 is a flowchart illustrating an example of a processing flow of a deterioration determination step of this exemplary embodiment. S201 to S203 are identical to those of the fourth exemplary embodiment. The deterioration determination step of this exemplary embodiment is different from that of the fourth exemplary embodiment in that a processing corresponding to S204 is more specified. The others are identical to that of the fourth exemplary embodiment.

That is, in the deterioration determination step of this exemplary embodiment, the charge and discharge and the measurement of the charge voltage value after the start of the discharge for a predetermined period of time are repeated a predetermined number of times (Yes in S203), and then the charge voltage value after the start of the discharge after the charge and discharge is repeated a predetermined number of times is predicted on the basis of the change mode of the charge voltage value after the start of the discharge due to the repetition of the charge and discharge (S205). Then, the deterioration state of the deterioration determination target is determined on the basis of a comparison result between the prediction value and the first reference value which is maintained in advance (S206).

According to this exemplary embodiment described above, the same functional effects as those of the first exemplary embodiment to the fourth exemplary embodiment are able to be realized.

In addition, it is possible to reduce the number of times of performing the charge and discharge and the measurement of the charge voltage value after the start of the discharge, and thus it is possible to improve processing efficiency.

Sixth Exemplary Embodiment

An example of a functional block diagram of the electric storage device 10 of this exemplary embodiment is able to be any one of FIG. 1 to FIG. 3. Hereinafter, the configuration of the determination unit 14 of this exemplary embodiment will be described. Furthermore, the configurations of the other units are identical to those described in the first exemplary embodiment to the third exemplary embodiment, and thus the description thereof will not be repeated herein.

The determination unit 14 of this exemplary embodiment includes a second determination unit which performs once the measurement processing of charging each of the plurality of battery cells up to a predetermined voltage value (Engineering expedient. Example: SOC is 100%), then discharging each of the plurality of battery cells (Engineering expedient. Example: the discharge is performed until SOC is less than or equal to 50%), and measuring the charge voltage value within a predetermined period of time (Engineering expedient. Example: approximately 1 minute to 2 minutes) from the start of the discharge, and after that, determines the deterioration state of each of the plurality of battery cells on the basis of a comparison result between the measurement value and a second reference value maintained in advance. The discharge is able to be performed by being connected to a predetermined load. A measurement unit for measuring the charge voltage value after the start of the discharge is not particularly limited.

Furthermore, it is not necessary that the charge and discharge for determining the deterioration state by using the second determination unit is specialized for determining the deterioration state, and the charge and the discharge in practical use of an electric storage device by the user are able to be used. That is, in the background of practical use of the electric storage device by the user, it is possible to perform determination processing of the deterioration state.

The second reference value is able to be a value which is obtained by simulating the charge voltage value after the start of the discharge in the deterioration determination target before standing, and may be an actual measured value, or may be a value determined by a simulation. The designer may determine the second reference value in advance on the basis of the design of the battery cell, and store the second reference value in the electric storage device 10. For example, the battery cell of which the charge voltage value after the start of the discharge (a representative value among the measurement values) obtained by performing the measurement described above once is greater than or equal to a predetermined ratio of the second reference value (Engineering expedient. Example: greater than or equal to 97%) may be determined as being in an acceptable state.

In this exemplary embodiment, the determination of the deterioration state of the first determination unit is performed with respect to only the battery cell in which the deterioration state is determined as being in a rejected state by the second determination unit. The first determination unit is identical to that described in the fourth exemplary embodiment and the fifth exemplary embodiment, and thus the description thereof will not be repeated herein.

Here, when the electric storage device 10 of this exemplary embodiment has the configuration illustrated in FIG. 2 described in the second exemplary embodiment, the monitor unit 15 monitors a period of time during which a state where the charge and discharge based on the control of the charge and discharge control unit 12 is not performed is continued, and inputs the determination start information which indicates when the state is continued for greater than or equal to a predetermined period of time (engineering expedient) into the determination unit 14. When the input of the determination start information is received from the monitor unit 15, afterward the determination unit 14 of this exemplary embodiment performs the determination of the deterioration state by using the second determination unit. Then, the determination of the deterioration state of the first determination unit is performed with respect to only the battery cell in which the deterioration state is determined as being in a rejected state by the second determination unit.

On the other hand, when the electric storage device 10 of this exemplary embodiment has the configuration illustrated in FIG. 3 described in the third exemplary embodiment, the output unit 16 monitors a period of time during which a state where the charge and discharge based on the control of the charge and discharge control unit 12 is not performed is continued, and outputs the determination start information which indicates when the state is continued for greater than or equal to a predetermined period of time (engineering expedient) toward the user. After that, when the input reception unit 17 receives the instruction input which starts the deterioration determination from the user, the determination unit 14 of this exemplary embodiment performs the determination of the deterioration state of the second determination unit. Then, the determination of the deterioration state of the first determination unit is performed with respect to only the battery cell in which the deterioration state is determined as being in a rejected state by the second determination unit.

According to this exemplary embodiment, the battery cell in which neither the temporary property deterioration due to the standing (the deterioration which is recovered by the repetition of the charge and discharge) nor the actual property deterioration (the deterioration which is not recovered by the repetition of the charge and discharge) is progressed up to a predetermined level is considered as being in an acceptable state, and such a battery cell is able to be excluded from the deterioration determination target of the first determination unit which is performed while repeating the charge and discharge. As a result thereof, an excellent effect such as an improvement in working efficiency and a reduction in the cost is realized.

Furthermore, according to this exemplary embodiment, the same functional effect as that of the first exemplary embodiment to the fifth exemplary embodiment is able to be realized.

Seventh Exemplary Embodiment

In this exemplary embodiment, a specific example of the electric storage device 10 of the fourth exemplary embodiment and the fifth exemplary embodiment will be described.

Figure 4:
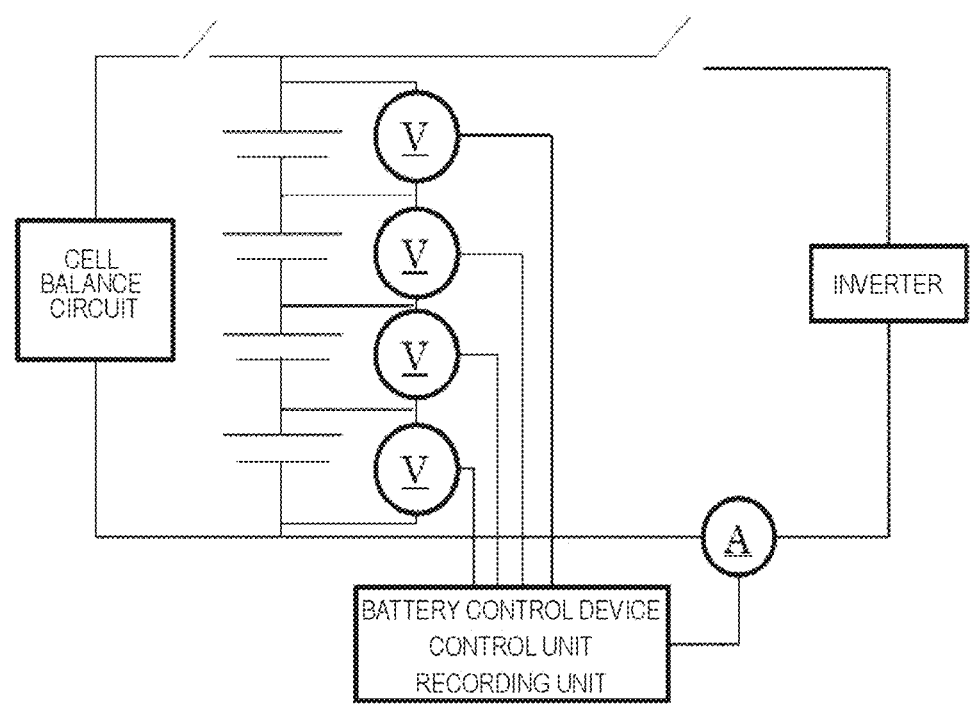
FIG. 4 is an example of a circuit diagram of the electric storage device of an exemplary embodiment.

FIG. 4 illustrates an example of a circuit diagram for performing the deterioration determination of each of the plurality of battery cells configuring the battery unit 11 of this exemplary embodiment. In the circuit diagram described above, in addition to the plurality of battery cells, a cell balance circuit (the cell balance unit 13), a battery control device (the charge and discharge control unit 12, for example, a Battery Management Unit (BMU) circuit), and an inverter are illustrated. Furthermore, the cell balance circuit and the battery control device are separately illustrated, but the cell balance circuit and the battery control device may be combined in a circuit by using a microcomputer or the like. A recording unit included in the battery control device records a measurement result of a voltage and a current of each battery cell. The recording unit may be embedded in the battery unit, or may be embedded in an external instrument.

In FIG. 4, a module is illustrated in which four battery cells are connected in series, but the number of connected battery cells is not limited, and the module may be a module configured of a plurality of parallel circuits or a plurality of parallel cells. The plurality of battery cells and the load, and the external instruments are electrically openable and closable by a relay or the like.

Figure 5:
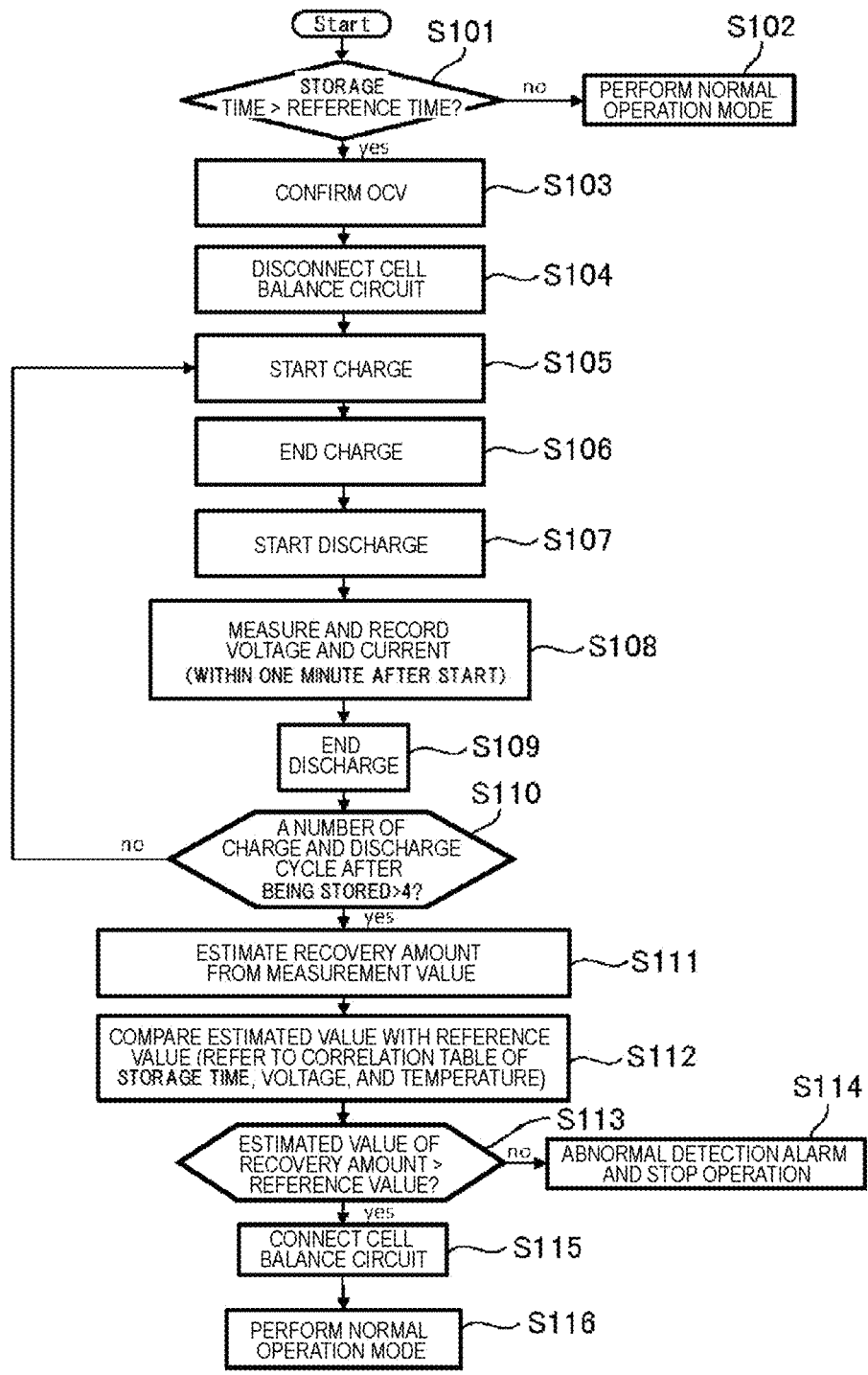
FIG. 5 is a flowchart illustrating an example of a processing flow of the electric storage device of an exemplary embodiment.

FIG. 5 is a flowchart illustrating an example of a processing flow of the electric storage device 10 of this exemplary embodiment.

First, when the electric storage device 10 receives an operation of operating a storage battery, that is, an operation of performing the charge or the discharge through the charge and discharge control unit 12, it is determined whether or not a period of time of standing in a state of not using the electric storage device 10 until that time point, that is, a period of time (a storage time) during which a state where the charge and discharge based on the control of the charge and discharge control unit 12 is not performed is continued until that time point exceeds a predetermined period of time (a reference time) (S101). The processing described above is able to be performed on the basis of a monitoring result of the monitor unit 15. Furthermore, the monitor unit 15 may be provided in the battery control device, and when the electric storage device 10 is able to be communicated with the external instrument, the monitor unit 15 may be provided in the external instrument.

It is preferable that the reference time is greater than or equal to 72 hours, and the reference time depends on the capacity, the area, and the configuration material of the cell, and thus is not particularly limited. Furthermore, information indicating the reference time may be stored in the battery control device in advance, or when the electric storage device 10 is able to be communicated with the external instrument, the information may be obtained from the external instrument.

When it is determined that the period of time does not exceed the reference time in S101 (no in S101), the process proceeds to a normal operation mode, and a normal operation is performed (S102).

In contrast, when it is determined that the period of time exceeds the reference time in S101 (yes in S101), the process proceeds to an operation mode which is performed while the deterioration determination is performed. Specifically, an open voltage of each of the plurality of battery cells is confirmed and recorded (S103), and then the cell balance circuits are disconnected from each other, and thus the balance processing is disabled (S104). Subsequently, a charge operation performed by the user is waited.

When the charge is performed up to a predetermined voltage value (Engineering expedient. Example: SOC is 100%) by the user operation (S105 and S106), afterward the discharge operation performed by the user is waited. Then, when the discharge is started by the user operation (S107), the charge voltage value (charge voltage value after the start of the discharge) of each of the battery cells within a predetermined period of time (Engineering expedient. Example: 1 minute to 2 minutes) from the start of the discharge is measured (S108), and the measurement result is recorded in the recording unit. After that, it is confirmed that the discharge is performed up to a predetermined voltage value (Engineering expedient. Example: SOC is less than or equal to 50%) (S109), and then the charge operation performed by the user is waited again.

Subsequently, a cycle from S105 to S110 is repeated a predetermined number of times (Engineering expedient. Example: 3 times, 4 times, 5 times, and the like) (yes in S110), and then the change mode of the cell voltage is specified by using the data recorded in the recording unit, and the charge voltage value after the start of the discharge after the charge and discharge is repeated a predetermined number of times is estimated (S111). As an estimation method, it is preferable to apply least squares fitting to data within one minute after the start of the discharge by an exponential function having a linear monotonic decrease. Here, the charge voltage value after the start of the discharge after repeating the charge and discharge 10 times is estimated. After that, the estimated value is compared with the first reference value (S112). The first reference value may be determined on the basis of a storage time, a storage temperature, a charge voltage value at the time of ending the charge, and the like. That is, the first reference value may be determined by preparing an arithmetic equation or a table calculating the first reference value from these values in advance, and by using the equation or the table.

As a result of the determination in S112, when the estimated value at the tenth charge and discharge in all of the battery cells is included in a predetermined value (Engineering expedient. Example: a value greater than or equal to 80% of the first reference value) (yes in S113), it is determined that the battery cell is in an acceptable state. Then, the balance processing is enabled (S115), the process proceeds to the normal operation mode, and then the normal operation is performed (S116).

In contrast, as a determination result in S112, when the estimated value at the tenth charge and discharge in at least one battery cell is not included in a predetermined value (Engineering expedient. Example: a value greater than or equal to 80% of the first reference value) (no in S113), it is determined that the battery cell is in a rejected state, abnormal detection alarm is issued, the discharge is performed up to a set lower limit, and the entire operation is stopped (S114).

According to this exemplary embodiment, the same functional effects as those of the first exemplary embodiment to the sixth exemplary embodiment are able to be realized.

EXAMPLE

Example 1

An electric storage device including a module in which 33 Ah cells were connected in series in four rows and a BMU control circuit was prepared. The electric storage device was discharged up to a predetermined state, and then stood in a state of not being used for 72 hours (in a state where the charge and the discharge excluding self-discharge were not performed). Furthermore, the battery cell is a laminated type and having A4-sized 30 sets of a positive electrode/a separator/a negative electrode which were laminated.

Figure 6:
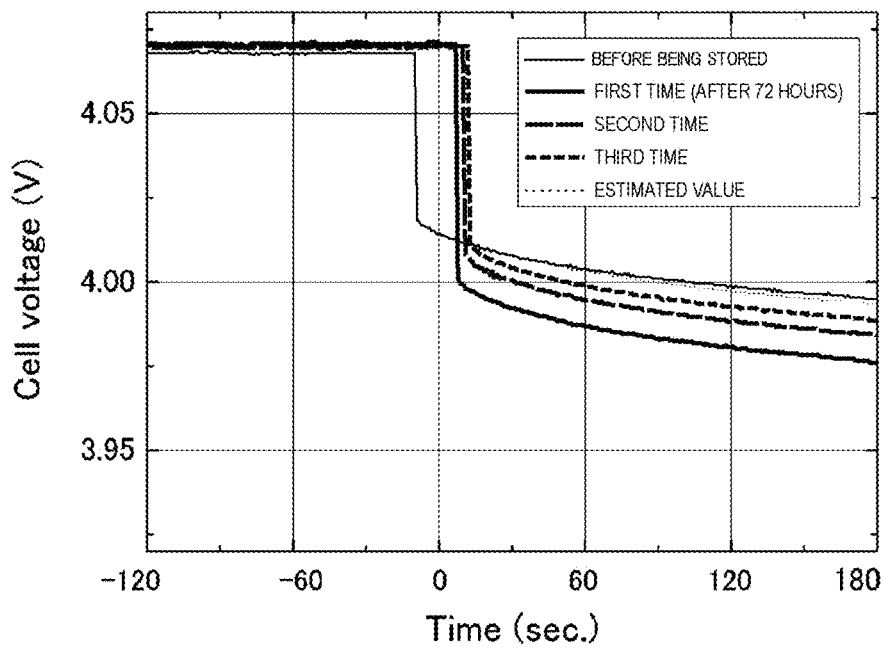
FIG. 6 is data illustrating results of examples.

After standing, with respect to each of the plurality of battery cells, the measurement processing of charging up to a predetermined voltage value, then discharging, and measuring the charge voltage value (the charge voltage value after the start of the discharge) within a predetermined period of time from the start of the discharge was repeated a plurality of times. The measurement data is illustrated in FIG. 6. The measurement data is data of the battery cells having the maximum voltage decrease among the plurality of battery cells. In the drawing, "First Time", "Second Time", and "Third Time" respectively indicate the charge voltage value after the start of the discharge after performing the charge and discharge each number of times. In FIG. 6, in addition, the charge voltage values after the start of the discharge (in the drawing, indicated as "before being stored") which are measured with respect to the battery cell before standing for 72 hours by using the same unit are illustrated.

From the drawing, it is found that a voltage decrease close to 20 mV occurs immediately after standing for 72 hours (the first time), compared to a state before standing. Then, it is found that the charge and discharge is repeated, and thus the cell voltage is recovered.

A broken line (the estimated value) in the drawing indicates the charge voltage value after the start of the discharge immediately after the charge and discharge is repeated 10 times, which is obtained by applying least squares fitting to the voltage within 1 minute after the start of the discharge. When the charge and discharge was repeated 10 times, it was estimated that the recovery was performed up to a value close to the charge voltage value after the start of the discharge before being stored.

Furthermore, the charge voltage value after the start of the discharge which was measured after the charge and discharge was actually repeated 10 times was compared with the estimated value, and it was confirmed that the estimation was performed with sufficient accuracy.

Example 2

An electric storage device including a module in which 33 Ah cells were connected in series in four rows and a BMU control circuit was prepared. The electric storage device was discharged up to a predetermined state, and then stood in a state of not being used for 1 week (in a state where the charge and the discharge excluding self-discharge were not performed). Furthermore, the battery cell is a laminated type and having A4-sized 30 sets of a positive electrode/a separator/a negative electrode which were laminated.

Figure 7:
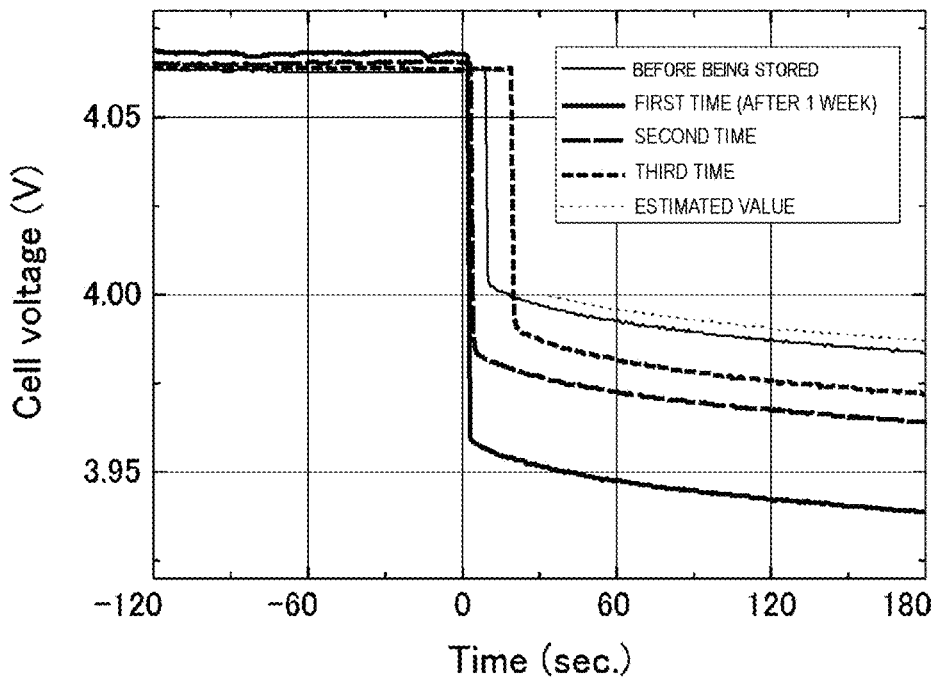
FIG. 7 is data illustrating results of examples.

After standing, with respect to each of the plurality of battery cells, the measurement processing of charging up to a predetermined voltage value, then discharging, and measuring the charge voltage value (the charge voltage value after the start of the discharge) within a predetermined period of time from the start of the discharge was repeated a plurality of times. The measurement data is illustrated in FIG. 7. The measurement data is data of the battery cells having the maximum voltage decrease among the plurality of battery cells. In the drawing, "First Time", "Second Time", and "Third Time" respectively indicate the charge voltage value after the start of the discharge after performing the charge and discharge each number of times. In FIG. 7, in addition, the charge voltage values after the start of the discharge (in the drawing, indicated as "before being stored") which are measured with respect to the battery cell before standing for 1 week by using the same unit are illustrated.

From the drawing, it is found that a voltage decrease close to 50 mV occurs immediately after standing for 1 week (the first time), compared to a state before standing. Then, it is found that the charge and discharge is repeated, and thus the cell voltage is recovered. In comparison with Example 1, it is found that the degree of the temporary property deterioration increases as a period of standing becomes longer.

A broken line (the estimated value) in the drawing indicates the charge voltage value after the start of the discharge immediately after the charge and discharge is repeated 10 times, which is obtained by applying least squares fitting to the voltage within 1 minute after the start of the discharge. When the charge and discharge was repeated 10 times, it was estimated that the recovery was performed up to a value close to the charge voltage value after the start of the discharge before being stored.

Furthermore, the charge voltage value after the start of the discharge which was measured after the charge and discharge was actually repeated 10 times was compared with the estimated value, and it was confirmed that the estimation was performed with sufficient accuracy.

APPENDIX

According to the above description, the present invention is described as follows.

APPENDIX 1

An electric storage device including a battery unit including a plurality of battery cells which are connected to each other; a charge and discharge control unit controlling charge and discharge of the plurality of battery cells; a cell balance unit performing balance processing which corrects a difference in a cell voltage between the plurality of battery cells; and a determination unit performing deterioration determination of each of the plurality of battery cells in a state in which the balance processing is disabled when the charge and discharge based on the control of the charge and discharge control unit is not performed for greater than or equal to a predetermined period of time.

APPENDIX 2

The electric storage device according to Appendix 1 further including a monitor unit monitoring a period of time during which a state of not performing the charge and discharge based on the control of the charge and discharge control unit is continued, and inputting determination start information which indicates when the state is continued for greater than or equal to a predetermined period of time into the determination unit, in which when the input of the determination start information is received from the monitor unit, the determination unit disables the balance processing, and starts the deterioration determination.

APPENDIX 3

The electric storage device according to Appendix 1 further including an output unit monitoring a period of time during which a state of not performing the charge and discharge based on the control of the charge and discharge control unit is continued, and outputting determination start information which indicates when the state is continued for greater than or equal to a predetermined period of time toward a user; and an input reception unit receiving an instruction input which starts the deterioration determination from the user, in which when the input reception unit receives the instruction input, the determination unit disables the balance processing, and starts the deterioration determination.

APPENDIX 4

The electric storage device according to any one of Appendixes 1 to 3, in which the determination unit includes a first determination unit which repeats a plurality of times measurement processing of charging each of the plurality of battery cells up to a predetermined voltage value, then discharging each of the plurality of battery cells, and measuring a charge voltage value within a predetermined period of time from the start of the discharge, and after that, determines a deterioration state of each of the plurality of battery cells in consideration of a change mode of the charge voltage value due to the repetition of the charge and discharge.

APPENDIX 5

The electric storage device according to Appendix 4, in which the first determination unit predicts the charge voltage value after repeating the charge and discharge a predetermined number of times on the basis of the change mode of the charge voltage value due to the repetition of the charge and discharge, and determines the deterioration state of each of the plurality of battery cells on the basis of a comparison result between a prediction value and a first reference value which is maintained in advance.

APPENDIX 6

The electric storage device according to Appendix 4 or 5, in which the determination unit includes a second determination unit which performs once the measurement processing of charging each of the plurality of battery cells up to a predetermined voltage value, then discharging each of the plurality of battery cells, and measuring the charge voltage value within a predetermined period of time from the start of the discharge, and after that, determines the deterioration state of each of the plurality of battery cells in consideration of a comparison result between a measurement value and a second reference value which is maintained in advance, and the first determination unit performs the determination of the deterioration state with respect to only the battery cell in which the deterioration state is not determined as being at an acceptable level set in advance by the second determination unit.

APPENDIX 7

The electric storage device according to any one of Appendixes 1 to 6, in which when it is determined that at least one deterioration state of the plurality of battery cells is at a rejection level by the determination unit, the discharge is performed up to a predetermined state, and then the entire operation is stopped.

APPENDIX 8

The electric storage device according to any one of Appendixes 1 to 7, in which the battery cell is a lithium ion secondary battery.

APPENDIX 9

A deterioration determination method, in which an electric storage device including a battery unit including a plurality of battery cells which are connected to each other, a charge and discharge control unit controlling charge and discharge of the plurality of battery cells, and a cell balance unit performing balance processing which corrects a difference in a cell voltage between the plurality of battery cells performs deterioration determination of each of the plurality of battery cells in a state in which the balance processing is disabled when the charge and discharge based on the control of the charge and discharge control unit is not performed for greater than or equal to a predetermined period of time.

APPENDIX 9-2

The deterioration determination method according to Appendix 9, in which in the deterioration determination, a first step which repeats a plurality of times measurement processing of charging each of the plurality of battery cells up to a predetermined voltage value, then discharging each of the plurality of battery cells, measuring a charge voltage value within a predetermined period of time from the start of the discharge, and after that, determines a deterioration state of each of the plurality of battery cells in consideration of a change mode of the charge voltage value due to the repetition of the charge and discharge is performed.

APPENDIX 9-3

The deterioration determination method according to Appendix 9-2, in which in the first step, the charge voltage value after repeating the charge and discharge a predetermined number of times is predicted on the basis of the change mode of the charge voltage value due to the repetition of the charge and discharge, and the deterioration state of each of the plurality of battery cells is determined on the basis of a comparison result between a prediction value and a first reference value which is maintained in advance.

APPENDIX 9-4

The deterioration determination method according to Appendix 9-2 or 9-3, in which in the deterioration determination, a second step which performs once the measurement processing of charging each of the plurality of battery cells up to a predetermined voltage value, then discharging each of the plurality of battery cells, and measuring the charge voltage value within a predetermined period of time from the start of the discharge, and after that, determines the deterioration state of each of the plurality of battery cells on the basis of a comparison result between a measurement value and a second reference value which is maintained in advance is performed, and the first step is performed with respect to only the battery cell in which the deterioration state is not determined as being at an acceptable level set in advance in the second step.

APPENDIX 9-5

The deterioration determination method according to any one of Appendixes 9 to 9-4, in which the battery cell is a lithium ion secondary battery.

This application claims priority on the basis of Japanese Patent Application No. 2013-021561, filed on Feb. 6, 2013, and the entire disclosure thereof is incorporated herein.

The invention claimed is:

1. An electric storage device, comprising:
    a battery unit including a plurality of battery cells which are connected to each other;
    a memory storing one or more programs; and
    a processor configured to execute the one or more programs to:
        control charge and discharge of the plurality of battery cells;
        perform balance processing which corrects a difference in a cell voltage between the plurality of battery cells; and
        perform deterioration determination of each of the plurality of battery cells when the charge and discharge based on the controlling of the charge and discharge is not performed for greater than or equal to a predetermined period of time;
        repeat measurement processing of charging each of the plurality of battery cells up to a predetermined voltage value, then discharge each of the plurality of battery cells, and measure a charge voltage value within a predetermined period of time from the start of the discharge a plurality of times, and after the measurement processing, determine a deterioration state of each of the plurality of battery cells in consideration of a change feature of the charge voltage value due to the repetition of the charge and discharge;
        perform once the measurement processing of charging each of the plurality of battery cells up to a predetermined voltage value, then discharge each of the plurality of battery cells, and measure the charge voltage value within a predetermined period of time from the start of the discharge, and after that, determine the deterioration state of each of the plurality of battery cells in consideration of a comparison result between a measurement value and a second reference value which is maintained in advance, and
        perform the determination of the deterioration state with respect to only the battery cell in which the deterioration state is not determined as being at an acceptable level set in advance by the processor;
    wherein the deterioration determination is performed in a state in which the balance processing is disabled.

2. The electric storage device according to claim 1, wherein the processor is further configured to execute the one or more programs to:
    monitor a period of time during which a state of not performing the charge and discharge based on the controlling of the charge and discharge is continued, and when the state is continued for greater than or equal to a predetermined period of time, generate determination start information which indicates the continued state,
    when the determination start information is generated, disable the balance processing, and start the deterioration determination.

3. The electric storage device according to claim 1, wherein the processor is further configured to execute the one or more programs to:
    monitor a period of time during which a state of not performing the charge and discharge based on the controlling of the charge and discharge is continued, and output determination start information toward a user, wherein the determination start information indicates when the state is continued for greater than or equal to a predetermined period of time; and receive an instruction input which starts the deterioration determination from the user, wherein when the instruction input is received, disable the balance processing, and start the deterioration determination.

4. The electric storage device according to claim 1, wherein the processor is further configured to execute the one or more programs to predict the charge voltage value after repeating the charge and discharge a predetermined number of times on the basis of the change feature of the charge voltage value due to the repetition of the charge and discharge, and determine the deterioration state of each of the plurality of battery cells on the basis of a comparison result between a prediction value and a first reference value which is maintained in advance.

5. The electric storage device according to claim 1, wherein when it is determined that at least one deterioration state of the plurality of battery cells is at a rejection level by the determination unit, the discharge is performed up to a predetermined state, and then the entire operation is stopped.

6. The electric storage device according to claim 1, wherein the battery cell is a lithium ion secondary battery.

7. A deterioration determination method, comprising allowing an electric storage device including a battery unit having a plurality of battery a processor configured to execute one or more programs to:

charge and discharge the plurality of battery cells;

perform balance processing which corrects a difference in a cell voltage between the plurality of battery cells;

perform deterioration determination of each of the plurality of battery cells when the charge and discharge based on the controlling of the charge and discharge is not performed for greater than or equal to a predetermined period of time;

repeat measurement processing of charging each of the plurality of battery cells up to a predetermined voltage value, then discharge each of the plurality of battery cells, and measure a charge voltage value within a predetermined period of time from the start of the discharge a plurality of times, and after the measurement processing, determine a deterioration state of each of the plurality of battery cells in consideration of a change feature of the charge voltage value due to the repetition of the charge and discharge;

perform once the measurement processing of charging each of the plurality of battery cells up to a predetermined voltage value, then discharge each of the plurality of battery cells, and measure the charge voltage value within a predetermined period of time from the start of the discharge, and after that, determine the deterioration state of each of the plurality of battery cells in consideration of a comparison result between a measurement value and a second reference value which is maintained in advance; and perform the determination of the deterioration state with respect to only the battery cell in which the deterioration state is not determined as being at an acceptable level set in advance by the processor;

wherein the deterioration determination is performed in a state in which the balance processing is disabled.

8. An electric storage device, comprising:

a battery means including a plurality of battery cells which are connected to each other;

a charge and discharge control means controlling charge and discharge of the plurality of battery cells;

a cell balance means performing balance processing which corrects a difference in a cell voltage between the plurality of battery cells; and a determination means performing deterioration determination of each of the plurality of battery cells when the charge and discharge based on the control of the charge and discharge is not performed for greater than or equal to a predetermined period of time, repeating measurement processing of charging each of the plurality of battery cells up to a predetermined voltage value, then discharging each of the plurality of battery cells, and measuring a charge voltage value within a predetermined period of time from the start of the discharge a plurality of times, and after the measurement processing, determining a deterioration state of each of the plurality of battery cells in consideration of a change feature of the charge voltage value due to the repetition of the charge and discharge, performing once the measurement processing of charging each of the plurality of battery cells up to a predetermined voltage value, then discharging each of the plurality of battery cells, and measuring the charge voltage value within a predetermined period of time from the start of the discharge, and after that, determining the deterioration state of each of the plurality of battery cells in consideration of a comparison result between a measurement value and a second reference value which is maintained in advance, and performing the determination of the deterioration state with respect to only the battery cell in which the deterioration state is not determined as being at an acceptable level set in advance by the processor;

wherein the deterioration determination is performed in a state in which the balance processing is disabled.

* * * * *